US009331040B2

(12) United States Patent
Beck et al.

(10) Patent No.: US 9,331,040 B2
(45) Date of Patent: May 3, 2016

(54) MANUFACTURE OF COATED COPPER PILLARS (71) Applicant: Atotech Deutschland GmbH, Berlin (DE)

(72) Inventors: Thomas Beck, Berlin (DE); Gerhard Steinberger, Bergfelde (DE); Andreas Walter, Dresden (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/429,364

(22) PCT Filed: Jul. 19, 2013

(86) PCT No.: PCT/EP2013/065296
§ 371 (c)(1),
(2) Date: Mar. 19, 2015

(87) PCT Pub. No.: WO2014/044435
PCT Pub. Date: Mar. 27, 2014

(65) Prior Publication Data
US 2015/0279797 A1    Oct. 1, 2015

(30) Foreign Application Priority Data

Sep. 19, 2012 (EP) .................................... 12185004

(51) Int. Cl.
*H01L 21/44*    (2006.01)
*H01L 23/00*    (2006.01)

(52) U.S. Cl.
CPC ................ *H01L 24/14* (2013.01); *H01L 24/11* (2013.01); *H01L 24/13* (2013.01); *H01L 24/03* (2013.01);

(Continued)

(58) Field of Classification Search
CPC . H01L 24/14; H01L 24/17; H01L 2224/0401; H01L 2224/13099; H01L 24/11; H01L 2924/01029; H01L 2924/00014; H01L 2224/13025; H01L 24/13; H01L 2924/01079; H01L 2224/13147; H01L 2224/13644; H01L 2924/00
USPC ............ 438/612–618; 257/E23.021, E23.069
See application file for complete search history.

(56) References Cited

U.S. PATENT DOCUMENTS

2009/0079094 A1    3/2009  Lin
2009/0206461 A1*   8/2009  Yoon ..................... H01L 21/565
                                                     257/686

(Continued)

FOREIGN PATENT DOCUMENTS

JP            3268431         11/1991

OTHER PUBLICATIONS

PCT/EP2013/065296; PCT International Search Report and Written Opinion of the International Searching Authority dated Nov. 6, 2013.

(Continued)

*Primary Examiner* — Jasmine Clark
(74) *Attorney, Agent, or Firm* — Renner, Otto, Boisselle & Sklar, LLP (57) ABSTRACT

The present invention relates to a method for forming a copper pillar on a semiconducting substrate, the copper pillar having an underbump metallization area comprising a metal less noble than copper and optionally a solder bump on the top portion, and having a layer of a second metal selected from tin, tin alloys, silver, and silver alloys deposited onto the side walls of said copper pillar. A layer of a first metal which is more noble than copper is deposited onto the entire outer surface of the copper pillar prior to deposition of the second metal layer. The layer of a second metal then has at least a reduced number of undesired pin-holes and serves as a protection layer for the underlying copper pillar.

20 Claims, 4 Drawing Sheets (52) U.S. Cl.
CPC ......... *H01L 24/05* (2013.01); *H01L 2224/0345* (2013.01); *H01L 2224/03464* (2013.01); *H01L 2224/0401* (2013.01); *H01L 2224/05568* (2013.01); *H01L 2224/05573* (2013.01); *H01L 2224/05583* (2013.01); *H01L 2224/05655* (2013.01); *H01L 2224/05657* (2013.01); *H01L 2224/05666* (2013.01); *H01L 2224/05681* (2013.01); *H01L 2224/10145* (2013.01); *H01L 2224/1147* (2013.01); *H01L 2224/1181* (2013.01); *H01L 2224/11462* (2013.01); *H01L 2224/11821* (2013.01); *H01L 2224/11822* (2013.01); *H01L 2224/11823* (2013.01); *H01L 2224/11825* (2013.01); *H01L 2224/11901* (2013.01); *H01L 2224/13005* (2013.01); *H01L 2224/13013* (2013.01); *H01L 2224/13014* (2013.01); *H01L 2224/13082* (2013.01); *H01L 2224/13083* (2013.01); *H01L 2224/13111* (2013.01); *H01L 2224/13147* (2013.01); *H01L 2224/13155* (2013.01); *H01L 2224/13157* (2013.01); *H01L 2224/13562* (2013.01); *H01L 2224/13565* (2013.01); *H01L 2224/13582* (2013.01); *H01L 2224/13611* (2013.01); *H01L 2224/13639* (2013.01); *H01L 2224/13644* (2013.01); *H01L 2224/13647* (2013.01); *H01L 2224/13664* (2013.01); *H01L 2224/13669* (2013.01); *H01L 2224/13673* (2013.01); *H01L 2224/13676* (2013.01); *H01L 2224/16507* (2013.01); *H01L 2924/00014* (2013.01); *H01L 2924/014* (2013.01); *H01L 2924/0132* (2013.01); *H01L 2924/10253* (2013.01); *H01L 2924/3841* (2013.01)

(56) References Cited

U.S. PATENT DOCUMENTS

| | | | |
|---|---|---|---|
| 2011/0006416 A1* | 1/2011 | Tseng et al. | H01L 24/11 257/737 |
| 2011/0062580 A1 | 3/2011 | Liu et al. | |
| 2011/0260317 A1 | 10/2011 | Lu et al. | |
| 2011/0285013 A1* | 11/2011 | Chuang et al. | H01L 23/3171 257/737 |
| 2012/0007231 A1 | 1/2012 | Chang | |

OTHER PUBLICATIONS

PCT/EP2013/065296; PCT International Preliminary Report on Patentability mailed Apr. 2, 2015.

* cited by examiner

Figure 1

PRIOR ART

MANUFACTURE OF COATED COPPER PILLARS

The present application is a U.S. National Stage Application based on and claiming benefit and priority under 35 U.S.C. §371 of International Application No. PCT/EP2013/065296, filed 19 Jul. 2013, which in turn claims benefit of and priority to European Application No. 12185004.4 filed 19 Sep. 2012, the entirety of each of which is hereby incorporated herein by reference.

FIELD OF THE INVENTION

The present invention relates to the manufacture of copper pillars on semiconducting substrates having protected side walls which are used in the field of electronic devices such as semiconductor micro-chips, interposers, and IC substrates. The copper pillars can have a solder cap layer on top.

BACKGROUND OF THE INVENTION

Copper pillars are used in high density interconnect packages for electrically connecting a semiconducting micro-chip with an interposer, an IC substrate or a printed circuit board. Optionally, the copper pillars have a solder cap layer attached on the top portion of the copper pillars.

The copper pillars are replacing conventional solder ball bumps in such applications because they provide a fixed stand-off independent of the pitch (inter distance) between individual copper pillar structures.

Figure 1:
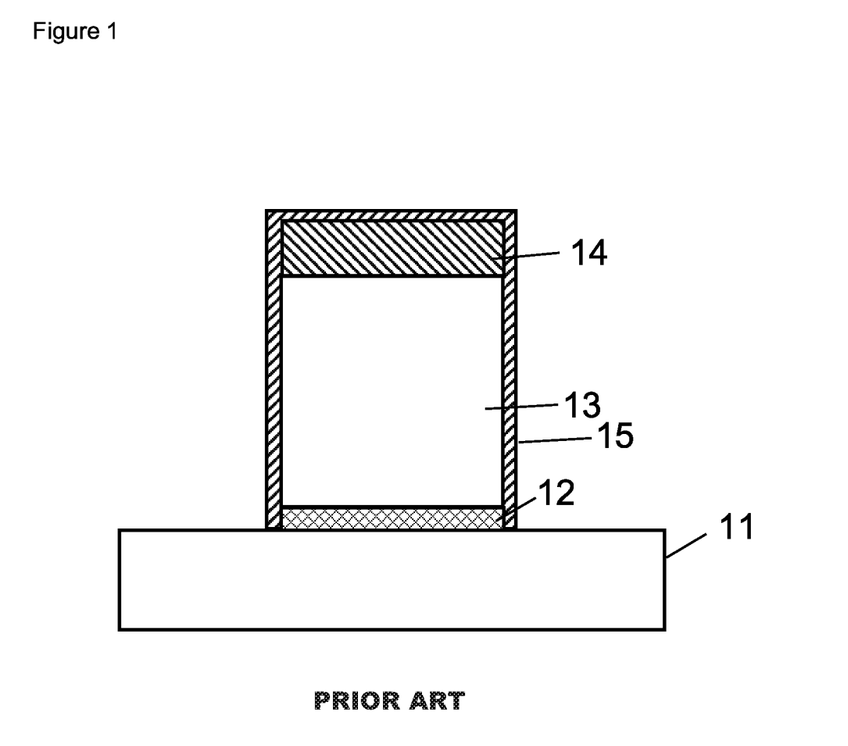
FIG. 1 shows a copper pillar with an underbump metallization area and a solder cap layer attached to the top portion manufactured according to the prior art.

FIG. 1 shows a method for manufacture of copper pillars according to the prior art. Copper pillars are usually manufactured on one side of a semiconductor substrate such as a micro-chip, referred herein as a die. The copper pillars (13) are formed by electroplating copper or a copper alloy into openings formed by a patterned resist material and onto an underbump metallization area (12) of a die (11) (FIG. 1). The underbump metallization area is a single layer comprising a metal less noble than copper, or a multilayer consisting of more than one individual layer of metals and/or metal alloys which are less noble than copper. The underbump metallization area has the main function of a barrier between copper and silicon and prevents undesired interdiffusion of said two elements.

Optionally, a solder material such as pure tin or a tin alloy such as tin-silver, tin-silver-copper or tin-silver-copper-nickel alloys is deposited onto the top portion of the copper pillars and thereby forming a solder cap layer (14). Such a method is for example disclosed in US 2005/0077624 A1.

The exposed side walls of the copper pillars are prone to undesired oxidation and/or other corrosion processes during further manufacturing steps of the die and the interconnect package.

A further disadvantage of such a copper pillar structure having a solder cap layer attached to the top portion is the good wettability of molten tin-based solder material on the side walls of the copper pillars. Accordingly, molten solder material can flow into the space between individual copper pillars during reflow operations and thereby undesired circuit shorts can be formed.

A method for manufacture of copper pillars having attached a solder material onto the top portion and having coated side walls is disclosed in US 2009/0127708 A1. The method disclosed therein comprises the steps of depositing a solder layer of tin or a tin alloy onto the top portion of the copper pillar and then depositing a thin protection layer (15) by immersion-type plating onto the entire outer surface of the copper pillar (FIG. 1).

Figure 2:
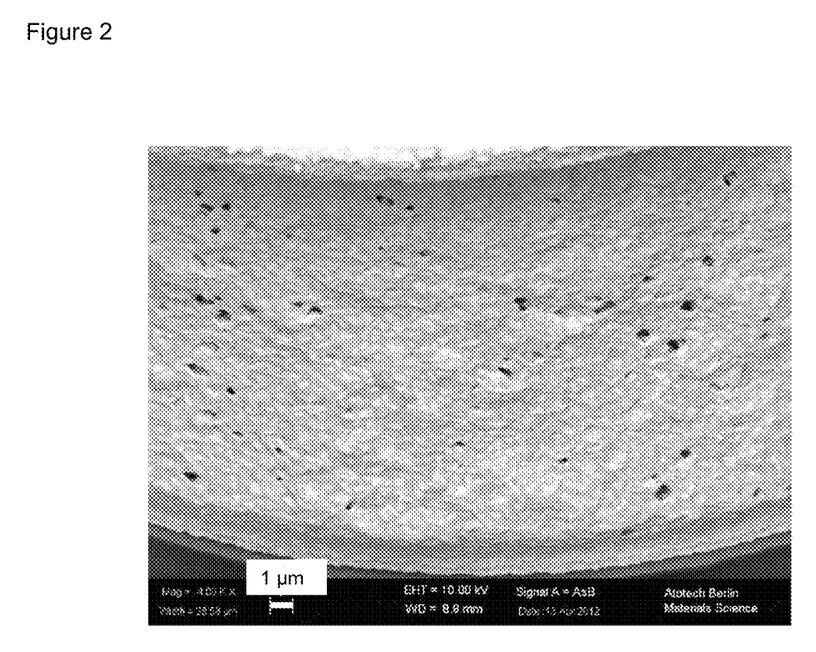
FIG. 2 shows a scanning electron micrograph of a protection layer on the side walls of a copper pillar with an underbump metallization area and a solder cap layer attached to the top portion manufactured according to the prior art.

The method disclosed in US 2009/0127708 A1 has a major disadvantage: undesired pin-holes are formed on the side walls of the copper pillars (13) when depositing the thin protection layer (15) onto the copper pillar (FIG. 2).

The undesired formation of pin-holes during immersion-type plating of a metal such as tin or silver is also observed for copper pillars (13) without a solder cap layer (14) of tin-based solder material on top of the copper pillar (13). Also in such a case the copper pillar (13) is formed on an underbump metallization area (12) which comprises at least one layer of a metal or metal alloy less noble than copper.

OBJECTIVE OF THE INVENTION

It is the objective of the present invention to provide a method for manufacture of copper pillars and copper pillars with a layer of a tin-based solder on the top portion of the copper pillar having a dense protection layer attached to the side walls of the copper pillars.

SUMMARY OF THE INVENTION

This objective is solved by a method for manufacture of coated copper pillars on a semiconducting substrate comprising, in this order, the steps of
 a. providing a semiconducting substrate with an array of copper pillars, the copper pillars having an underbump metallization area comprising a metal or metal alloy less noble than copper and optionally further having attached a solder cap layer on the top portion,
 b. depositing a first metal layer comprising a metal which is more noble than copper onto the entire outer surface of the copper pillars, and
 c. depositing a second metal layer selected from the group consisting of tin, tin alloys, silver, and silver alloys by immersion-type plating onto the first metal layer.

The resulting coated copper pillar obtained comprises a dense protection layer on the side walls.

DETAILED DESCRIPTION OF THE INVENTION

Figure 3:
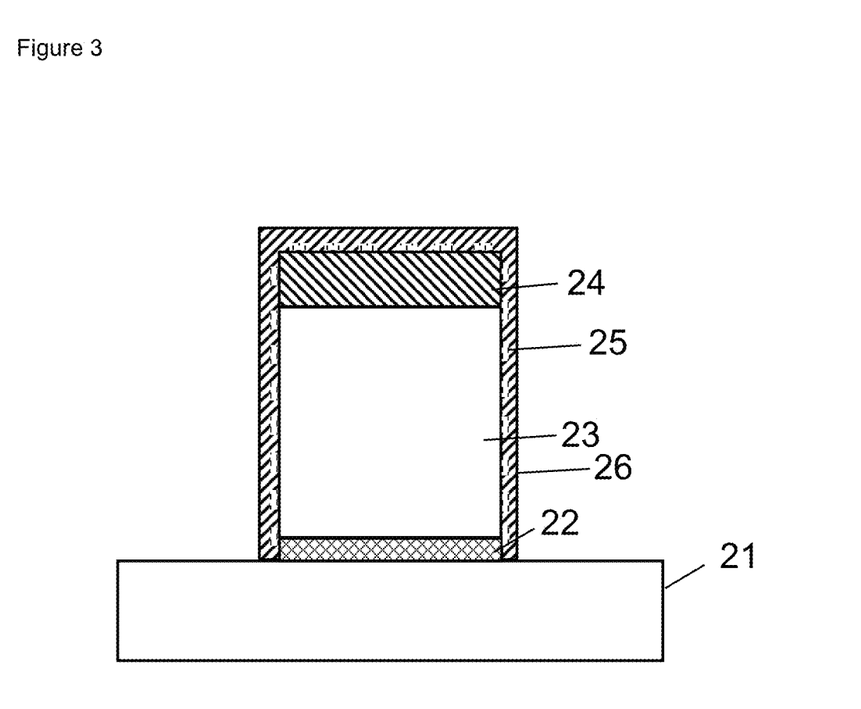
FIG. 3 shows a copper pillar with an underbump metallization area and a solder cap layer attached to the top portion manufactured by the method according to the present invention.

Materials applied in the method according to the present invention as substrate (21) are semiconducting materials, preferably silicon wafer materials. Copper pillars (23) are formed by electroplating into openings of a patterned resist material.

Copper pillars (23) are deposited onto an underbump metallization area (22) which comprises for example a barrier layer made of tantalum, titanium or titanium-tungsten alloys deposited by physical vapour deposition, or nickel alloys such as nickel-phosphorous alloys, nickel-boron alloys, ternary nickel-molybdenum-phosphorous alloys and ternary cobalt alloys such as cobalt-tungsten-phosphorous alloys and cobalt-molybdenum-phosphorous alloys deposited by electroless plating. The barrier layer serves as to prevent diffusion of copper from the pillars into the semiconducting substrate.

The underbump metallization area (22) may consist of a barrier layer of a metal or metal alloy mentioned before and in addition of a thin layer of copper deposited by a physical vapour phase deposition method or by electroless plating onto the barrier layer which serves as a plating base for successive electroplating of copper. The underbump metallization area (22) may also consist of three distinct metal and/or metal alloy layers.

Accordingly, the underbump metallization area (22) contains at least one layer of a metal or metal alloy which is less noble than copper.

Copper pillars (23) preferably have a height in the range of from 10 to 200 μm, more preferably from 40 to 100 μm and have a circular or rectangular shape. The diameter of circular copper pillars (23) preferably ranges of from 10 to 200 μm, more preferably from 20 to 100 μm. Copper pillars (23) having a rectangular shape preferably have a base side length in the range of from 10 to 200 μm, more preferably from 20 to 100 μm.

Such copper pillars (23) are usually arranged in arrays of several copper pillars (23) on the semiconducting substrate (21). The array can be for example a one dimensional array or a two dimensional array of copper pillars (23).

A solder cap layer (24) also referred herein as a solder bump is optionally deposited for example by electroplating onto the top portion of the copper pillar (23). The solder cap layer preferably comprises tin and may be selected from pure tin and tin alloys such as tin-silver alloys, tin-silver-copper alloys, and tin-silver-copper-nickel alloys which are currently employed as tin-lead solder replacements.

A method for manufacture of a semiconducting substrate comprising copper pillars (23) having a solder cap layer (24) attached to the top portion is disclosed in US 2009/0127708 A1 and serves in one embodiment of the present invention as the substrate to be treated by the method according to the present invention.

Optionally, a second barrier layer is deposited onto the top portion of the copper pillar (23) prior to deposition of the optional solder cap layer (24). Suitable materials for the optional second barrier layer are preferably selected from nickel alloys such as nickel-phosphorous alloys and nickel-boron alloys, ternary nickel alloys such as nickel-moybdenum-phosphorous alloys and ternary cobalt alloys such as cobalt-tungsten-phosphorous and cobalt-molybdenum-phosphorous alloys. The optional second barrier layer may be deposited by electroless plating. Suitable plating bath compositions and plating parameters are known in the art. Such an optional second barrier layer suppresses undesired interdiffusion of copper and the material of the solder cap layer (24).

The semiconducting substrate (21) comprising an array of copper pillars (23), the copper pillars having an underbump metallization area (22) comprising a metal or metal alloy less noble than copper is provided. Optionally, a solder cap layer (24) is attached on the top portion of the copper pillars (23)

Next, the exposed surface of the copper pillars (23) is cleaned. Preferably, etch cleaner compositions comprising an acid and optionally further comprising a surfactant agent and/or an oxidizing agent are employed to clean the surface of the copper pillar (23). A particularly suitable etch cleaner composition comprises water, sulfuric acid and hydrogen peroxide.

Optionally, etch cleaning is followed by a rinse in an aqueous solution of an acid such as sulfuric acid.

In another embodiment of the present invention a plasma treatment is applied to clean the surface of the copper pillar (23).

Combinations of etch cleaning and plasma treatment may by applied to clean the surface of the copper pillar (23).

Optionally, a treatment for removal of undesired particles from the surface of the copper pillar (23) is applied in addition to an etch cleaning and/or a plasma treatment. A particularly suitable treatment of this kind is a standard clean 1 (SC1) treatment which comprises the step of treating the surface of the copper pillar (23) with an aqueous solution comprising aluminium hydroxide and hydrogen peroxide. Compositions and treatment conditions of this kind are known in the art.

The cleaned surface of the copper pillars (23) is then contacted with a solution comprising ions of a metal which is more noble than copper and thereby the first metal layer (25) is deposited onto the exposed outer surface of the copper pillar (23) by an immersion-type reaction wherein copper is oxidized and the metal ions of a metal more noble than copper are reduced to metallic state and thereby deposited onto the copper surface. Such immersion-type plating bath solutions and suitable plating conditions are known in the art.

The metal ions of a metal which is more noble than copper are preferably selected from the group consisting of silver, palladium, platinum, rhodium, ruthenium, gold, and alloys thereof.

More preferably, the metal ions of a metal which is more noble are palladium ions.

The solution comprising metal ions of a metal more noble than copper preferably is an aqueous solution.

Said solution may further comprise at least one acid or a salt thereof.

A particularly preferred aqueous solution for deposition of a palladium layer as first metal layer (25) comprises palladium ions, at least one acid or a salt thereof.

The source of palladium ions may be selected from the group comprising palladium sulfate, palladium chloride, palladium acetate and palladium perchlorate. The concentration of palladium ions in the aqueous solution preferably ranges from 2 to 200 ppm, more preferably from 5 to 50 ppm.

The at least one acid or salt thereof is preferably selected from the group comprising sulfuric acid, nitric acid, and hydrochloric acid. Suitable counter ions for salts of the at least one acid may be selected from the group comprising sodium, potassium, and ammonium. The concentration of the at least one acid or salt thereof preferably is adjusted to give a bath pH of the immersion-type palladium plating bath in the range of 1 to 7, more preferably from 1 to 4.

The temperature of the immersion-type plating bath during deposition of the first metal layer (25) preferably ranges from 20 to 90° C., more preferably from 20 to 40° C.

The substrate (21) comprising an array of copper pillars (23) having an underbump metallization area (22) comprising a metal or metal alloy less noble than copper and optionally further having attached a solder cap layer (24) on the top portion is contacted with the immersion-type plating bath for deposition of the first metal layer (25) preferably by dipping or spraying.

The expression "layer" in respect to the first metal layer (25) has to be considered in a broader sense: the layer of a metal more noble than copper obtained by immersion-type plating is not a dense layer of said metal more noble than copper. Depending on e.g. the concentration of metal ions in the solution employed for the immersion-type plating, the temperature of said solution during plating, and the plating time, differently sized islands of the metal more noble than copper are deposited onto the copper pillar (23). It is not considered a distinct layer of the layer assembly but rather an activation, which forms a metal seed layer. Such seed layer is typically a few angstroms in thickness.

In addition, the metal more noble than copper is also deposited onto the optional solder cap layer (24) on the top portion of the copper pillar (23).

A non-dense first metal layer (25) is also required for deposition of the second metal layer (26) onto the side walls of the copper pillar (23), because the second metal layer (26) preferably is deposited by immersion-type plating. Hence, parts of the underlying copper pillar (23) need to be accessible for metal ions from said immersion-type plating bath in order to deposit the second metal layer (26).

Next, the second metal layer (26) is deposited onto the surface of the copper pillar (23) comprising a first metal layer (25) without applying an external electrical current to the substrate (21) during deposition. Preferably, the second metal layer (26) is deposited by immersion-type plating.

The second metal layer (26) is preferably selected from tin, tin alloys, silver and silver alloys.

Most preferably, the second metal layer (26) is selected from tin and tin alloys.

In one embodiment of the present invention the silver or silver alloys are not selected for the second metal layer (26) in case the first metal layer (25) is selected from silver and silver alloys.

Silver and silver alloys may be deposited from an aqueous immersion-type plating bath comprising a source of silver ions, such as silver methane sulfonate, optionally a source of ions of a second metal such as palladium ions in case a silver alloy is to be deposited, and further additives such as imidazole or benzimidazole and/or an acid such as methane sulfonic acid.

Suitable aqueous immersion-type plating baths for deposition of silver or a silver alloy may further comprise surface active agents and a complexing agent for copper ions (deriving from the copper surface during immersion-type plating) such as 2,2'-bipyridyl.

The concentration of silver ions preferably ranges from 0.5 to 5 g/l, more preferably from 0.75 to 2 g/l. The concentration of the optional acid preferably ranges from 0.1 to 2 mol/l. The concentration of optional ions of a second metal preferably ranges from 1 to 100 mg/l, more preferably from 15 to 50 mg/l.

The temperature of the silver or silver alloy immersion-type plating bath during deposition of silver or the silver alloy preferably ranges from 15 to 45° C., more preferably from 15 to 35° C. and most preferably from 20 to 35° C.

Tin may be deposited from an aqueous immersion-type plating bath comprising Sn(II) ions and thiourea and/or a derivative thereof. The addition of a complexant such as thiourea and/or derivatives thereof is required whenever tin or a tin alloy is deposited by an immersion-type plating process onto copper or a copper alloy. The role of thiourea and/or a derivative thereof is to support the dissolution of copper by forming Cu(I) thiourea complexes during the immersion reaction with Sn(II) ions. As copper is more noble than tin such a support reaction is required to reduce Sn(II) ions by oxidation of copper.

Acidic immersion-type plating baths for deposition of tin and tin alloys comprising thiourea and/or derivatives thereof are known since a long time (The Electrodeposition of Tin and its Alloys, M. Jordan, Eugen G. Leuze Publishers, 1995, pages 89 to 90 and references cited therein).

The source of Sn(II) ions in the immersion-type plating bath is only limited to water soluble compounds. Preferred sources of Sn(II) compounds are selected from the group comprising organic sulfonates of Sn(II) such as tin methane sulfonate, tin sulfate and tin chloride.

The amount of Sn(II) ions in the immersion-type plating bath preferably ranges from 1 to 30 g/l, more preferably from 5 to 15 g/l.

The immersion-type plating bath for depositing tin further comprises at least one acid or a salt thereof such as an alkyl sulfonic acid or an aromatic sulfonic acid. Suitable counter ions for salts of the at least one acid are selected from the group comprising sodium, potassium, and ammonium.

The overall concentration of acids and/or salts thereof in the immersion-type plating bath preferably ranges from 0.1 to 1.5 mol/l, more preferably from 0.3 to 1.2 mol/l and most preferably from 0.5 to 1.0 mol/l.

The at least one complexant in the immersion-type plating bath is selected from the group consisting of thiourea and/or derivatives thereof. Thiourea derivatives are preferably selected from the group comprising mono- and di-alkyl thiourea having an alkyl group of $C_1$ to $C_3$. The most preferred complexant is thiourea.

The at least one complexant which is selected from thiourea and/or derivatives thereof is preferably added to the plating bath in an amount of 50 to 150 g/l, more preferably in an amount of 90 to 120 g/l.

Optionally, the immersion plating bath further contains ions of a second metal, such as Ag(I) ions. By adding ions of a second metal, a tin alloy layer is obtained. The optional ions of a second metal are preferably added to the plating bath in a concentration of 0.1 to 500 mg/l, more preferably 0.5 to 250 mg/l and most preferably from 1 to 50 mg/l.

The source of Ag(I) ions can be any water soluble Ag(I) salt. Sources of Ag(I) ions are preferably selected from the group consisting of silver sulfate and silver salts of alkyl or aromatic sulfonic acids. Tin-silver alloys deposited by immersion-type plating are less sensitive to whisker growth which may be another source for undesired circuit shorts between copper pillars.

Optionally, the immersion plating bath further contains at least one second complexant selected from the group consisting of mono carboxylic acids, poly carboxylic acids, hydroxy carboxylic acid, amino carboxylic acids and salts thereof. Suitable cations in case a salt is used are for example sodium, potassium, and ammonium.

Mono carboxylic acids are defined here as compounds having one carboxyl moiety per molecule. Poly carboxylic acids are carboxylic acids having more than one carboxyl moiety per molecule. Hydroxyl carboxylic acids are carboxylic acids having at least one carboxyl and at least one hydroxyl moiety per molecule. Amino carboxylic acids are carboxylic acids having at least one carboxyl and at least one amine moiety. The amine moiety can be a primary, secondary or tertiary amine moiety.

Preferred poly carboxylic acids as the optional second complexant are selected from the group consisting of oxalic acid, malonic acid and succinic acid.

Preferred hydroxy carboxylic acids as the optional second complexant are selected from aliphatic hydroxy carboxylic acids having an alkyl group of $C_1$ to $C_6$. The most preferred hydroxy carboxylic acids as the optional second complexants are selected from the group consisting of glycolic acid, lactic acid, citric acid, tartaric acid and salts thereof.

Preferred amino carboxylic acids as the optional second complexant are selected from the group consisting of glycine, ethylenediamine tetraacetic acid (EDTA), diethylenetriamine pentaacetic acid (DTPA) and triethylenetetramine hexaacetic acid (TTHA).

The concentration of the optional second complexant preferably ranges from 0.1 to 100 g/l, more preferably from 40 to 70 g/l.

Optionally, the immersion plating bath further comprises at least one aromatic sulfonic acid such as benzene sulfonic acid and/or toluene sulfonic acid.

Optionally, the immersion plating bath further contains a hypophosphite compound. The preferred hypophosphite compounds are sodium hypophosphite, potassium hypophosphite and ammonium hypophosphite.

The concentration of the optional hypophosphite compound preferably ranges from 0.1 to 200 g/l, more preferably from 1 to 150 g/l and most preferably from 10 to 120 g/l.

The temperature of the immersion-type tin or tin alloy plating bath during use ranges from 20 to 85° C. The substrate immersion time in the immersion tin plating bath ranges from 1 to 60 min.

The semiconducting substrate (21) comprising an array of copper pillars (23) optionally having a solder cap layer (24) on the top portion is contacted with said immersion-type plating bath by either dipping the substrate into a plating tank filled with said immersion-type plating bath or by spraying the immersion-type plating bath onto the substrate.

Optionally the semiconducting substrate (21) is contacted with an aqueous pre-treatment composition which may comprises the same or similar ingredients as the immersion-type tin or tin alloy plating bath except the metal ions.

The thickness of the second metal layer (26) attached to the surface of the copper pillar (23) preferably ranges from 0.05 to 2 µm, more preferably from 0.1 to 0.5 µm.

Intermetallic copper-tin phases such as $\eta$-$Cu_6Sn_5$ and $\epsilon$-$Cu_3Sn$ phases may be formed during deposition of the second metal layer (26) comprising tin and even more during reflow operations. In case the thickness of a second metal layer (26) comprising tin deposited onto the surface of the copper pillar (23) is thin enough, the second metal layer (26) comprises a surface of such intermetallic copper-tin phases instead of a pure tin surface.

In one embodiment of the present invention, the second metal layer (26) comprising tin is thin enough after deposition that a surface comprising copper-tin intermetallic phases is formed during plating and/or reflow operations.

Surfaces comprising said intermetallic phases are known to have a low wettability for molten tin-based solder materials. Accordingly, the space between individual copper pillars (23) in an array of copper pillars (23) is less likely to be contaminated by molten tin-based solder materials.

In summary, the deposition of a first metal layer (25) which comprises a metal more noble than copper prior to deposition of the second metal layer (26) which is selected from the group consisting of tin, tin alloys, silver and silver alloys leads at least to a reduced number of undesired pin-holes on the side walls of the copper pillars. Accordingly, the protection properties of a second metal layer (26) on the side walls of a copper pillar (23) are improved.

EXAMPLES

The invention will now be illustrated by reference to the following non-limiting examples.

Silicon substrates comprising an array of copper pillars on top of an underbump metallization area which comprises a metal less noble than copper, and a solder cap layer comprising tin attached to the top portion of the copper pillars were used throughout all examples.

The side walls of copper pillars were investigated by scanning electron microscopy after deposition of the second metal layer comprising tin.

Example 1 (Comparative)

The copper pillars were cleaned with an aqueous etch cleaner (Xenolyte® Cleaner D, a product of Atotech Deutschland GmbH).

Next, the substrate was dipped for 5 min in an immersion-type tin plating bath comprising a source of Sn(II) ions, thiourea and methane sulfonic acid at 35° C. A tin layer having a thickness of 0.2 µm was obtained as the second metal layer (26).

A silicon substrate having an array of copper pillar according to FIG. 1 was obtained which comprises undesired pinholes in those areas where tin was deposited onto the copper pillar as the second metal layer (FIG. 2).

Example 2

The copper pillars were cleaned with an aqueous etch cleaner (Xenolyte® Cleaner D, a product of Atotech Deutschland GmbH).

Next, the substrate was dipped into the aqueous solution comprising 10 ppm Pd ions and sulfuric acid and having a pH value of 1.

The substrate was then dipped for 5 min in a immersion-type tin plating bath comprising a source of Sn(II) ions, urea and methane sulfonic acid at 35° C. A tin layer having a thickness of 0.2 µm was obtained as the second metal layer (26).

Figure 4:
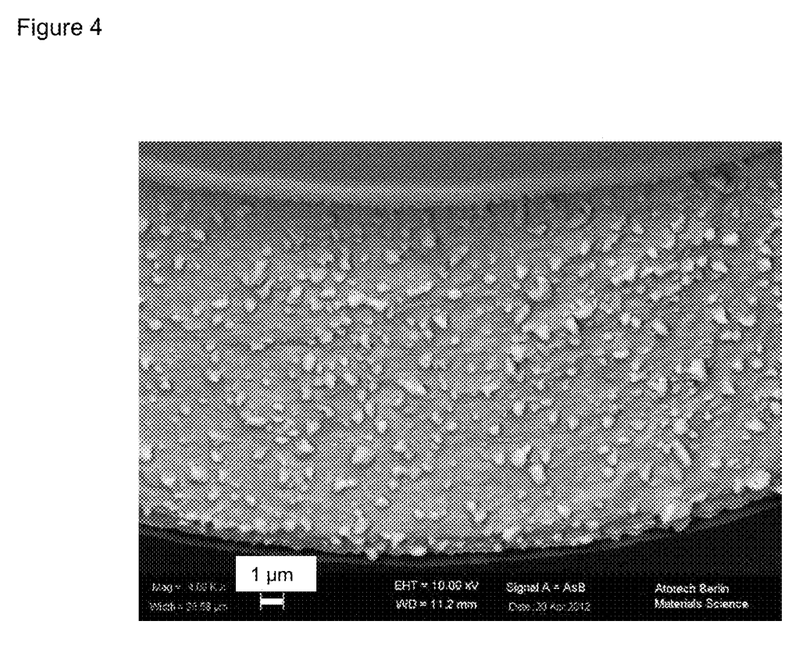
FIG. 4 shows a scanning electron micrograph of a protection layer on the side walls of a copper pillar with an underbump metallization area and a solder cap layer attached to the top portion manufactured by the method according to the present invention.

A substrate comprising an array of copper pillars according to FIG. 3 was obtained which comprises a protection layer free of undesired pin-holes (FIG. 4).

The invention claimed is:

1. A method for manufacture of coated copper pillars on a semiconducting substrate comprising, in this order, the steps of
   a. providing a semiconducting substrate with an array of copper pillars, the copper pillars having an underbump metallization area comprising a metal or metal alloy less noble than copper, and a solder cap layer attached to the top portion of the copper pillars,
   b. depositing a first metal layer comprising a metal which is more noble than copper onto the entire outer surface of the copper pillars, and
   c. depositing a second metal layer selected from the group consisting of tin, tin alloys, silver, and silver alloys by immersion-type plating onto the first metal layer,
   wherein the metal which is more noble than copper is selected from the group consisting of silver, palladium, platinum, rhodium, ruthenium, gold and alloys thereof with the proviso that silver and silver alloys are not selected as first metal layer if the second metal layer comprises silver or a silver alloy.

2. The method for manufacture of coated copper pillars according to claim 1 wherein the semiconducting substrate is a silicon substrate.

3. The method for manufacture of coated copper pillars according to claim 1 wherein the solder cap layer comprises tin.

4. The method for manufacture of coated copper pillars according to claim 1 wherein the metal which is more noble than copper is palladium.

5. The method for manufacture of coated copper pillars according to claim 1 wherein the second metal layer comprises tin and further comprises silver.

6. The method for manufacture of coated copper pillars according to claim 1 wherein the second metal layer further comprises copper in the form of a copper-tin alloy.

7. A method for manufacture of coated copper pillars on a semiconducting substrate comprising, in this order, the steps of
 a. providing a semiconducting substrate with an array of copper pillars, the copper pillars having an underbump metallization area comprising a metal or metal alloy less noble than copper, and a solder cap layer attached to the top portion of the copper pillars,
 b. depositing a first metal layer comprising a metal which is more noble than copper onto the entire outer surface of the copper pillars, and
 c. depositing a second metal layer selected from the group consisting of tin, tin alloys, silver, and silver alloys by immersion-type plating bath onto the first metal layer, wherein the first metal layer is deposited by immersion-type plating bath.

8. The method for manufacture of coated copper pillars according to claim 7 wherein the immersion-type plating bath comprises a source of metal ions of the metal more noble than copper and at least one acid and/or salt thereof.

9. The method for manufacture of coated copper pillars according to claim 7 wherein the second metal layer is deposited from an aqueous plating bath comprising a source of tin ions, thiourea and/or a derivative thereof, and optionally a source of a second metal.

10. The method for manufacture of coated copper pillars according to claim 9 wherein the second metal layer further comprises copper in the form of a copper-tin alloy.

11. The method for manufacture of coated copper pillars according to claim 7 wherein the metal which is more noble than copper is selected from the group consisting of silver, palladium, platinum, rhodium, ruthenium, gold and alloys thereof with the proviso that silver and silver alloys are not selected as first metal layer if the second metal layer comprises silver or a silver alloy.

12. The method for manufacture of coated copper pillars according to claim 7 wherein the metal which is more noble than copper is palladium.

13. The method for manufacture of coated copper pillars according to claim 7 wherein the solder cap layer comprises tin.

14. The method for manufacture of coated copper pillars according to claim 7 wherein the second metal layer comprises tin and further comprises silver.

15. A method for manufacture of coated copper pillars on a semiconducting substrate comprising, in this order, the steps of
 a. providing a semiconducting substrate with an array of copper pillars, the copper pillars having an underbump metallization area comprising a metal or metal alloy less noble than copper, and a solder cap layer attached to the top portion of the copper pillars,
 b. depositing a first metal layer comprising a metal which is more noble than copper onto the entire outer surface of the copper pillars, and
 c. depositing a second metal layer selected from the group consisting of tin, tin alloys, silver, and silver alloys by immersion-type plating onto the first metal layer, wherein the second metal layer is tin or a tin alloy.

16. The method for manufacture of coated copper pillars according to claim 15 wherein the metal which is more noble than copper is palladium.

17. The method for manufacture of coated copper pillars according to claim 15 wherein the metal which is more noble than copper is selected from the group consisting of silver, palladium, platinum, rhodium, ruthenium, gold and alloys thereof with the proviso that silver and silver alloys are not selected as first metal layer if the second metal layer comprises silver or a silver alloy.

18. The method for manufacture of coated copper pillars according to claim 15 wherein the solder cap layer comprises tin.

19. The method for manufacture of coated copper pillars according to claim 15 wherein the second metal layer further comprises copper in the form of a copper-tin alloy.

20. The method for manufacture of coated copper pillars according to claim 15 wherein the second metal layer comprises tin and further comprises silver.

\* \* \* \* \*